United States Patent [19]

Schülke

[11] Patent Number: 4,477,112
[45] Date of Patent: Oct. 16, 1984

[54] SEMICONDUCTOR SUBSTRATE HANDLING TRAY

[75] Inventor: Karl A. Schülke, Neuberg, Fed. Rep. of Germany

[73] Assignee: Heraeus Quarzschmelze GmbH, Hanau, Fed. Rep. of Germany

[21] Appl. No.: 486,152

[22] Filed: Apr. 18, 1983

Related U.S. Application Data

[63] Continuation of Ser. No. 246,132, Feb. 23, 1981, abandoned.

[30] Foreign Application Priority Data

Jun. 30, 1980 [DE] Fed. Rep. of Germany ....... 3024751

[51] Int. Cl.³ ............................................. B65D 25/28
[52] U.S. Cl. ..................................... 294/16; 294/172
[58] Field of Search ............... 294/172, 34, 16, 26.5, 294/27 R, 27 H, 31.2, 87 R; 206/328, 316, 445, 334

[56] References Cited

U.S. PATENT DOCUMENTS 4,195,871  4/1980  Chilton et al. ..................... 294/16

Primary Examiner—James B. Marbert
Attorney, Agent, or Firm—Frishauf, Holtz, Goodman & Woodward

[57] ABSTRACT

A generally trough-like elongated element is formed of quartz glass, open at the top, in which the side walls (2) which, preferably, have inclined portions (4) merging with the bottom wall (1) of the trough, are formed with through-slits (3), and the bottom wall is formed with slots (5) cut therein, leaving, however, the end portions solid and uncut; the end portions are formed with positioning or alignment notches (6) extending in a direction transverse to the bottom wall which, preferably, is formed with a recess or notch for engagement with a transport apparatus. The side walls preferably have holes extending, in longitudinal alignment, through the solid end portions to permit passage of the tines of a handling fork (8) therethrough. The slits (3) and the slots (5) provide for three-point suspension of disk or plate-like semiconductor substrates for handling and introduction, for example, into a treatment or diffusion furnace or tube.

5 Claims, 1 Drawing Figure

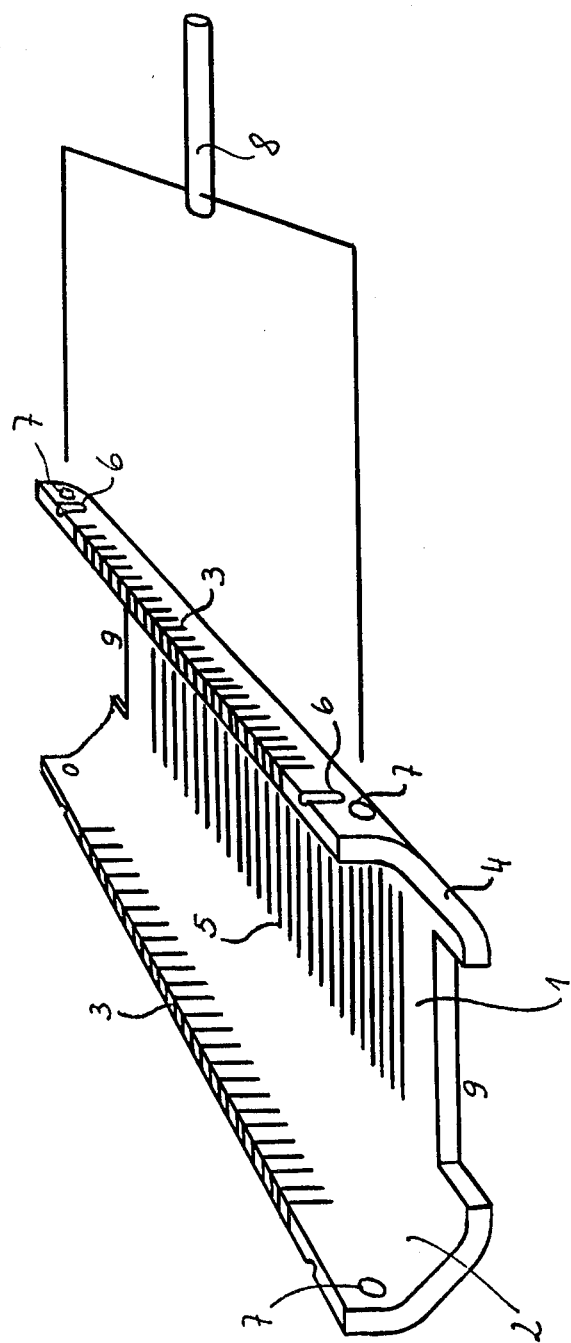

SEMICONDUCTOR SUBSTRATE HANDLING TRAY

This application is a continuation of application Ser. No. 246,132, filed on Feb. 23, 1981 now abandoned.

The present invention relates to an article of manufacture, and specifically to a semiconductor substrate handling tray to receive and hold disk or plate-like semiconductor substrates for subsequent treatment, for example in treatment furnaces, diffusion apparatus, and the like.

BACKGROUND

Various types of handling trays for semiconductor substrates are used in the industry. One type consists of an essentially rectangular—in cross section—quartz glass tube which has slits cut into the sides extending towards the interior of the tube as well as slits cut in alignment in the bottom wall thereof. This type of holder has been used in the industry under part No. Q-B 3/112 3 C 7411 Ku by Heraeus Quarzschmelze, and known as "Quartz Glass for Semiconductor Technology" and described in a prospectus therefor. The end regions of the quartz glass tube are formed with coaxial bores extending from the top to the bottom which are used to shift the tubular carriers into the diffusion tubes for treatment of the semiconductor substrate after the substrates have been loaded thereon. The substrates are supported at three points symmetrically within the holder. This symmetrical three-point support has been found eminently suitable. The manufacture of the holders for the substrates, however, is relatively expensive.

THE INVENTION

It is an object to provide a holder for semiconductor substrates made of quartz glass which has the desirable properties of three-point suspension of the substrates, uses less material, and is easier to make, and which can be handled easily and reliably and which, further, facilitates transfer of the semiconductor substrates from standard holder or supply racks or units.

Briefly, the semiconductor handling tray is formed as a generally trough-like elongated element, open at the top and at the ends, and having a bottom wall with upstanding side walls extending therefrom, preferably first at an angle and then vertically with respect to the bottom wall. The bottom wall is formed with slots therein, and slits are cut into the side walls, the slits in the side walls extending up to the open-end edges thereof. The lateral end portions of at least the side walls are left solid and free from slots and slits; alignment notches are formed in the solid end portions of the side walls extending vertically, that is, in a direction at right angles to the bottom wall. In a preferred form, the side walls are formed with aligned holes extending through the thickness thereof adjacent the ends to permit introduction of a handling fork.

The open construction of the trough-like holding tray results in a rack-like arrangement which can readily be fashioned of quartz glass, has excellent access to the semiconductor substrates, permits easy loading and safe and reliable handling of the tray, whether loaded or empty.

DRAWING

The single FIGURE is a highly schematic view of the carrier tray and illustrating also schematically and in exploded form a handling fork for handling of the tray, whether empty or loaded.

The tray is a single unitary body made of quartz glass. It has a bottom wall 1 and two upstanding laterally positioned side walls 2. The upper edge of the side walls is slitted as seen at 3. The lower wall region 4 of the side walls is inclined at an angle of about 45°—see the FIGURE—with respect to the bottom wall 1, so that the upper side walls extending at right angle from the lower bottom 1, will merge smoothly therewith and without forming a sharp corner. Thus, in an end view, the structure is essentially half-rectangular, with smooth corner portions. Slot-like cuts 5 are formed in the bottom wall 1, open towards the interior of the trough, that is, upwardly. The depth of the slots 5 is about half the thickness of the bottom wall 1. The slits 3 extend throughout the width of the side walls 2, and, in a vertical direction, reach downwardly from the upper edge of the side walls preferably not more than about one-quarter of the height between the upper edge of the side walls 2 and the upper surface of the bottom wall 1.

The end portions, looked at in longitudinal direction, of the side walls are left solid, that is, are not formed with slits. Vertically aligned placement and adjustment notches or grooves 6 are formed in the side walls 2, the notches or grooves 6 extending perpendicularly to the plane of the bottom wall 1. The alignment recesses 6 are used to adjust the position of the carrier or tray upon loading the carrier with semiconductor disks from standard supply elements. Additionally, through-bores 7 are formed in the solid end portions to receive the tines of a fork-like holding element 8 for transport and holding of the carrier. The bottom wall 1 is formed with a notch 9 at the end regions thereof, extending transversely to the longitudinal axis of the carrier. This bottom recess or notch 9 is used for proper placement of the carriers on transport devices which include rollers, and which transport the carrier, when loaded with semiconductor disks, into a diffusion tube or furnace for treatment of the semiconductor substrate disks loaded thereon.

As can readily be seen, the carrier disk is readily manufactured. A half-cylindrical tube or cup, which can be already pre-formed, is shaped into a tub or trough-like form, as best seen in the drawing. The slits 3 are then cut into the upper edge of the side walls and the slots 5 into the bottom wall 1. The adjustment or positioning grooves or notches are milled in the position shown, and the bores 7 as well as the recesses 9 are formed in the trough. Only few manufacturing steps are necessary to form the slits 3, the slots 5, and the positioning and transport recesses, openings, and notches 6, 7, 9. The quartz glass is used economically without, however, impairing support of semiconductor substrates and still providing for the desirable three-point support thereof. The accurate placement of the adjustment and positioning notches or grooves 6 as well as of the holes 7 for a handling fork can be effected by simple machining steps. The handling element 8, as such, is of the simplest form while reliably supporting the trough-like carrier, whether empty or loaded.

I claim:

1. A semi-conductor substrate handling tray to receive and hold disk or plate-like semi-conductor substrates comprising a generally trough-like elongated element of quartz glass which is open at the top and at the ends, and having a bottom wall (1) and side walls (2), said side walls having upper portions extending at right angles with respect to the bottom wall and essentially straight inclined connecting portions (4) extending at an angle of approximately 45° from the bottom wall (1) to the upper portions and smoothly angularly merging with the bottom wall and the upper portions, free from sharp corners;

slots (5) cut into the bottom wall which extend to a depth of about half the thickness of the bottom wall, and slits (3) cut into the upper portions of the side walls, said slits extending from the upper edge of the upper portions of the side walls up to about one quarter of the distance between the upper edge of the side walls and the bottom surface of the bottom wall and terminating above the inclined connecting portions, said slots and slits being located at intermediate—with respect to the longitudinal extent of the tray—portions thereof to receive the disk or plate-like substrates therein in stacked alignment and to provide for three-point retention of the substrates in the bottom slot and opposite sides in said slits in the upper portions of the side walls (2) and the essentially straight inclined connection portions (4) leaving space between the walls of the connecting portion and the edges of the disk, or plate-like semiconductor substrates for longitudinal passage of treatmentgas to which the substrates are to be exposed;

alignment notches or grooves (6) formed in the solid end portions of the side walls (2) extending in a direction transverse to the plane of the bottom wall (1);

transverse holes (7) formed in the solid end portions of the side walls and extending, in transverse alignment, through the thicknesses of the side walls to receive a holding or carrier fork (8) having projecting tines spaced from each other by the distance of the holes (7) in the respective end portions of the side walls, and for lifting and supporting the carrier, while leaving the region of the carrier in which said slits (3) and said slots (5) are formed free and unobstructed.

2. Handling tray according to claim 1, wherein the bottom wall (1) is formed with a recess or notch (9) in the solid end portions thereof, extending transversely to the longitudinal axis of the bottom wall.

3. Handling tray according to claim 1, wherein the bottom wall (1) is formed with a recess or notch (9) in the solid end portions thereof, extending transversely to the longitudinal axis of the bottom wall.

4. Handling tray according to claim 1, further including transverse openings (7) formed in the solid end portions of the side walls and extending, in transverse alignment, through the thicknesses of the side walls.

5. Handling tray according to claim 4, in combination with a holding or carrier fork (8) having projecting tines spaced from each other by the distance of the holes (7) in the respective end portions of the side walls for passing through the aligned openings in the side walls and for lifting and supporting the carrier, while leaving the region of the carrier in which said slits (3) and said slots (5) are formed free and unobstructed.

* * * * *